(12) United States Patent
Krause et al.

(10) Patent No.: US 9,444,226 B2
(45) Date of Patent: Sep. 13, 2016

(54) DIODE LASER

(75) Inventors: Volker Krause, Lonnig (DE); Arnd Kösters, Waldalgesheim (DE); Georg Rehmann, Koblenz (DE); Daniel Dünnwald, Bendorf (DE); Jörg Malchus, Sankt Johann (DE); Markus Baumann, Mülheim-Kärlich (DE)

(73) Assignee: LASERLINE GESELLSCHAFT FUR ENTWICKLUNG UND VERTRIEB VON DIODENLASERN MBH, Mulheim-Karlich (DE)

( * ) Notice: Subject to any disclaimer, the term of this patent is extended or adjusted under 35 U.S.C. 154(b) by 0 days.

(21) Appl. No.: 13/441,369

(22) Filed: Apr. 6, 2012

(65) Prior Publication Data
US 2012/0307853 A1 Dec. 6, 2012

(30) Foreign Application Priority Data

Jun. 4, 2011 (DE) ........................ 10 2011 016 253

(51) Int. Cl.
*H01S 5/40* (2006.01)
*H01S 5/00* (2006.01)
*G02B 27/09* (2006.01)
*G02B 19/00* (2006.01)

(52) U.S. Cl.
CPC ......... *H01S 5/4031* (2013.01); *G02B 19/0014* (2013.01); *G02B 19/0057* (2013.01); *G02B 27/0905* (2013.01); *H01S 5/005* (2013.01); *H01S 5/0071* (2013.01); *H01S 5/4012* (2013.01); *H01S 5/405* (2013.01); *H01S 5/4075* (2013.01)

(58) Field of Classification Search
CPC .. H01S 5/005; H01S 5/0071; H01S 5/02288; H01S 5/02292; H01S 5/4012; H01S 5/405; H01S 5/7075; G02B 19/0057; G02B 27/0905
USPC ........................................ 372/50.12; 359/618
See application file for complete search history.

(56) References Cited

U.S. PATENT DOCUMENTS

| 6,124,973 A * | 9/2000 | Du et al. ........................ 359/618 |
| 6,771,686 B1 * | 8/2004 | Ullman et al. ................... 372/92 |
| 2010/0265713 A1* | 10/2010 | Krause et al. ................. 362/259 |

FOREIGN PATENT DOCUMENTS

| CN | 201444219 U | * | 4/2010 |
| CN | 101442180 B | * | 9/2011 |
| DE | 19743322 | | 7/1998 |
| DE | 19918444 | | 2/2001 |
| DE | 19939750 | | 3/2001 |
| DE | 10012480 | | 9/2001 |
| EP | 1601072 | | 11/2005 |

* cited by examiner

*Primary Examiner* — Tod T Van Roy
(74) *Attorney, Agent, or Firm* — Welsh Flaxman & Gitler LLC (57) ABSTRACT

A diode laser arrangement having a number of laser bars, wherein each laser bar has a number of emitters generating laser beams arranged offset in a stacked manner to one another, in at least two stacks to form the arrangement.

20 Claims, 4 Drawing Sheets

DIODE LASER

BACKGROUND OF THE INVENTION

The invention relates to a diode laser arrangement having a plurality of laser bars, wherein each laser bar has a plurality of emitters generating laser beams arranged offset with respect to one another.

In contrast to conventional laser beam sources which have a beam diameter of a few millimeters with a low beam divergence in the range of a few mrad, the radiation of a semiconductor or diode laser (hereinafter "diode laser") is characterised by a highly divergent beam in the fast axis having a divergence >1000 mrad. This is caused by the outlet layer limited to <1 μm height, at which a large angle of divergence is produced, similar to the diffraction at a slit-shaped opening. Since the extension of the outlet opening in the plane perpendicular and parallel to the active semiconductor layer is different, different beam divergences come about in the plane perpendicular and parallel to the active layer.

In order to achieve a power of 20-40 W for a diode laser, numerous laser emitters are combined on a so-called laser bar to form a laser component. Usually 10-50 individual emitter groups are arranged here in a row in the plane parallel to the active layer. The resulting beam of such a bar has an aperture angle of about 10° and a beam diameter of about 10 mm in the plane parallel to the active layer. The resulting beam quality in this plane is many times lower than the resulting beam quality in the previously described plane perpendicular to the active layer. Even with a possible future reduction in the angle of divergence of laser chips, the very different ratio of the beam quality perpendicular and parallel to the active layer will persist.

As a result of the previously described beam characteristic, the beam has a very large difference in beam quality in both directions perpendicular and parallel to the active layer. The concept of the beam quality is in this case described by the $M^2$ parameter. $M^2$ is defined by the factor by which the beam divergence of the diode laser beam lies above the beam divergence of a diffraction-limited beam of the same diameter. In the case shown above, a beam diameter which is a factor of 10,000 above the beam diameter in the perpendicular plane is obtained in the plane parallel to the active layer. The situation is different with the beam divergence, i.e. an almost ten times lower beam divergence is achieved in the plane parallel to the active layer or in the slow axis. The $M^2$ parameter in the plane parallel to the active layer is therefore several orders of magnitude above the $M^2$ value in the plane perpendicular to the active layer.

One possible aim of beam shaping is to achieve a beam having almost the same $M^2$ values in both planes, i.e. perpendicular and parallel to the active layer. At the present time, the following methods are known for shaping the beam geometry by which an approximation of the beam qualities in the two principal planes of the beam is achieved.

By means of a fiber bundle, linear beam cross-sections can be combined by rearranging the fibers to form a circular bundle. Such methods are described, for example, in the U.S. Pat. Nos. 5,127,068, 4,763,975, 4,818,062, 5,268,978 and 5,258,989.

In addition, there is the technique of beam rotation in which the radiation of individual emitters is rotated by 90° in order to thus make a rearrangement in which the beams are arranged in the direction of the axis of better beam quality. The following arrangements are known for this method: U.S. Pat. No. 5,168,401, EP 0 484 276, DE 4,438, 368. All these methods have in common that after being collimated, the radiation of a diode laser is rotated by 90° in the fast axis direction in order to perform a slow-axis collimation with a common cylindrical optics. As a modification of the said methods, a continuous linear source is also feasible (i.e. that of a diode laser of high surface density, collimated in the fast axis direction), whose beam profile (line) is split and is present in rearranged form after the optical element.

In addition, it is possible to perform a rearrangement of the radiation of individual emitters without any rotation of the beam where a rearrangement of the radiation is achieved, for example, by the parallel offset (displacement) by means of parallel mirrors (WO 95/15510). An arrangement which also uses the rearrangement technique is described in DE 19 5 44 488. In this case, the radiation of a diode laser bar is deflected in different planes and individually collimated there.

The disadvantages of this art can be summarised inter alia in that in fiber-coupled diode lasers a beam having very different beam qualities in both axial directions is usually coupled into the fiber. In the case of a circular fiber this means that in one axial direction the possible numerical aperture or the fiber diameter is not used. This leads to appreciable losses in the power density so that in practice this is restricted to about $10^4$ W/cm$^2$.

In the said known methods, in some cases appreciable path length differences must furthermore be compensated. This is mainly achieved by correction prisms which can only compensate for defects to a limited extent. Multiple reflections furthermore impose increased requirements on alignment accuracy, production tolerances and component stability (WO 95/15510). Reflecting optics (e.g. made of copper) have high absorption values.

Further known is a laser optical system of the genreforming type for reshaping at least one laser beam bundle using at least two optical reshaping elements disposed successively in the beam path, which are configured as so-called plate fans (DE 10012480 A1).

In the hitherto known diode lasers the radiation power of the diode laser arrangement is limited and specifically in particular by the fact that the available laser bars have a limited length, for example, a length of about 10 mm in their slow axis (plane of the emitter layers) and the typical optical output power of a laser bar, for example, lies in the range of 250 Watts maximum. On account of the dimensions exhibited in particular by the heat sinks used as supports for the laser bars in the direction of the fast axis, in which the laser bars are provided offset with respect to one another in a stack-like manner in the laser diode arrangement and also on account of the need for optical elements which must be provided on the individual laser bars for fast axis collimation, the stack density of the laser bars within the stack comprising these laser bars and the appurtenant supports or heat exchangers is limited.

It is the object of the invention to provide a diode laser which makes it possible to achieve an improved optical power without losses of beam quality.

SUMMARY OF THE INVENTION

A diode laser arrangement is provided having a plurality of laser bars, wherein each laser bar has a plurality of emitters generating laser beams arranged offset with respect to one another, wherein the laser bars are provided offset in a stacked manner in at least two stacks to form the laser diode arrangement.

As a result of the at least two stacks of the laser diode arrangement, almost twice the optical power can be achieved with the same size and stack density of the laser bars and specifically without losses of beam quality of the laser radiation after the reshaping.

In the invention, the laser diode arrangement producing the laser radiation comprises at least two parallel stacks offset with respect to one another in the direction of the slow axis, consisting of a plurality of laser bars and appurtenant supports or heat sinks. All the laser bars are thereby arranged with their longitudinal extension or slow axis parallel to one another. The first plate fan arrangement following the laser diode arrangement in the beam path and/or fast axis collimators there and used for beam shaping is designed as a fast-axis plate fan arrangement and specifically for fanning out the beam bundles generated by the laser bars each into a plurality of mutually offset individual beam bundles in the direction of the fast axis of the laser radiation, which are then shifted together or over one another in the direction of the slow axis in a following slow-axis plate fan arrangement in the beam path. For this purpose the fast axis plate fan arrangement has at least two parallel fast-axis plate fans spaced apart from one another in the direction of the slow axis of the laser radiation, each consisting of at least two plates. In one embodiment of the invention, these fast-axis plate fans are pivoted relative to one another about an axis parallel to the slow axis of the laser radiation so that the fanning out of the beam bundle produced by the laser bars of each stack is an arrangement of mutually offset fanned-out individual beam bundles which (arrangement) is mutually offset from the corresponding arrangement of the fanned-out individual beam bundles of another stack in an axial direction perpendicular to the beam path of the laser radiation, preferably in the fast axis.

By corresponding arrangement and/or formation of the fast-axis and slow-axis plate fan arrangements, the fanning out of the beam bundles is to be configured so that the fanned-out individual beam bundles of all the stacks are provided mixed in a common plane and/or overlaid or overlapping.

Preferably a slow-axis collimating optics is provided in the beam path after the slow-axis plate fan arrangement so that a parallel or substantially parallel laser radiation is then obtained.

"Plate fan" in the sense of the invention is to be understood as an optical element which is transilluminated or passed by the laser light or laser light beams and which is composed of at least two plates or plate-shaped elements made of a light-conducting material, preferably of optical glass, which adjoin one another in a stack-like manner and are twisted with respect to one another in a fan-like manner. Each plate or each plate-shaped element forms on mutually opposite sides a plate narrow side or a plate edge zone for light inlet or outlet. "Surface sides of the plates" are to be understood in the sense of the invention as respectively the large plate sides.

The plates are positioned and configured, for example, taking into account the arrangement of the emitters and the divergence exhibited by the laser beams in the slow axis so that a reflection of the respective laser beam is not accomplished inside the plate on the surface sides.

"Plate thickness" is to be understood in the sense of the invention as the distance between the two surface sides from one another.

The respective plate fans can be produced by combining of individual plates or plate-shaped elements or also in one piece, for example, as a shaped part having corresponding optical dividing or intermediate layers.

A "fast-axis plate fan arrangement" or a "fast-axis plate fan" in the sense of the invention is a plate fan arrangement or a plate fan with which a fanning out of the beam bundle is accomplished in the fast axis.

A "slow-axis plate fan arrangement" or a "slow-axis plate fan" in the sense of the invention is a plate fan arrangement or a plate fan with which a combining of the fanned-out beam bundle is accomplished in the slow axis.

The expression "substantially" or "about" means in the sense of the invention deviations from respectively exact values by +/−10%, preferably by +/−5% and/or deviations in the form of insignificant changes for the function.

Further developments, advantages and possible applications of the invention are obtained from the following description of exemplary embodiments and from the figures. In this case, all the features described and/or shown pictorially by themselves or in any combination are fundamentally the subject matter of the invention.

BRIEF DESCRIPTION OF THE DRAWINGS

The invention is explained in detail in the following with reference to the figures for an exemplary embodiment. In the figures.

DETAILED DESCRIPTION OF THE INVENTION

Figure 1:
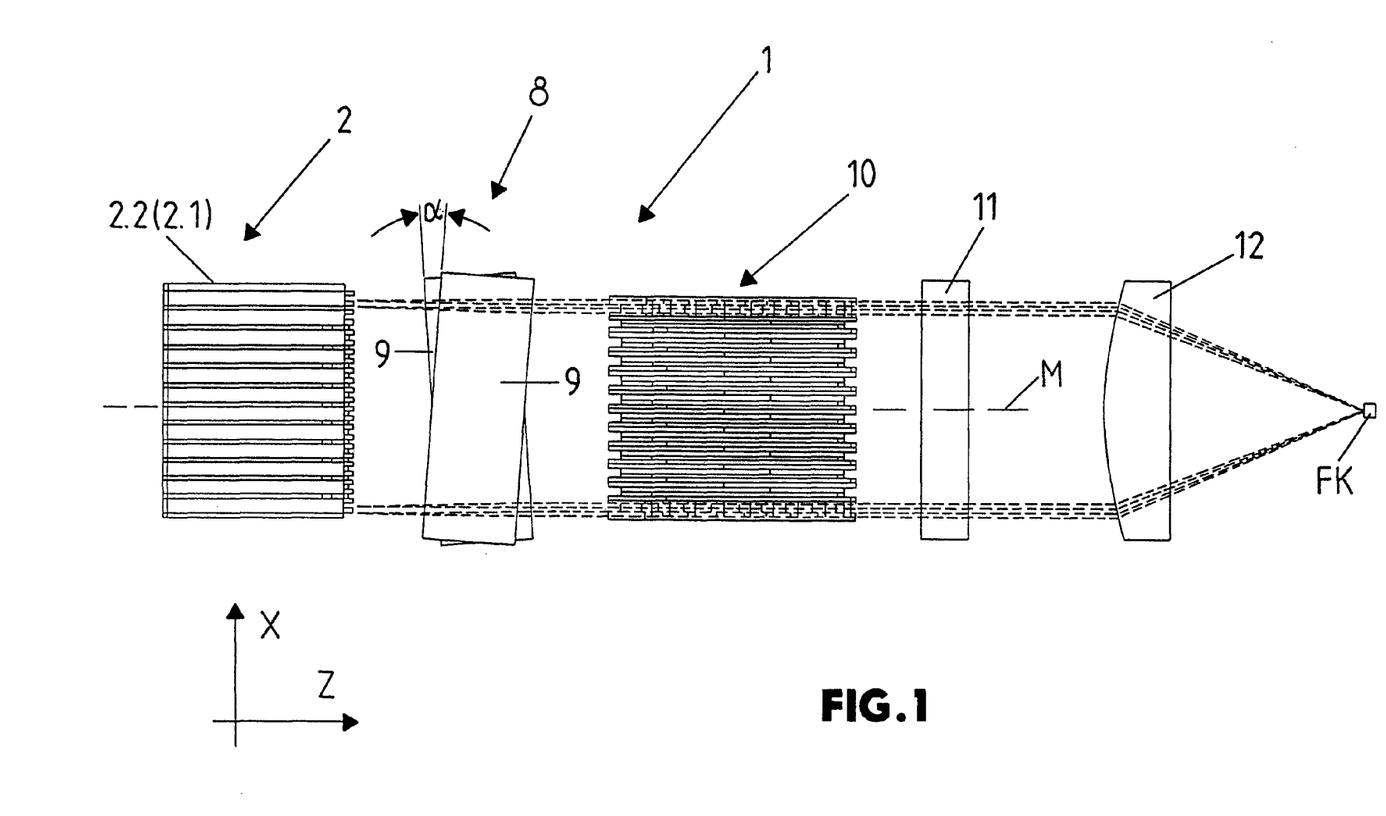
FIG. 1 shows a simplified view of a diode laser comprising a laser diode arrangement comprising a plurality of laser elements or laser chips (laser bars) and an optical arrangement disposed in the beam path of this laser diode arrangement for shaping and focusing the laser beam, where the plane of the drawing in FIG. 1 is oriented perpendicular to the active layer of the laser diode arrangement.
Figure 2:
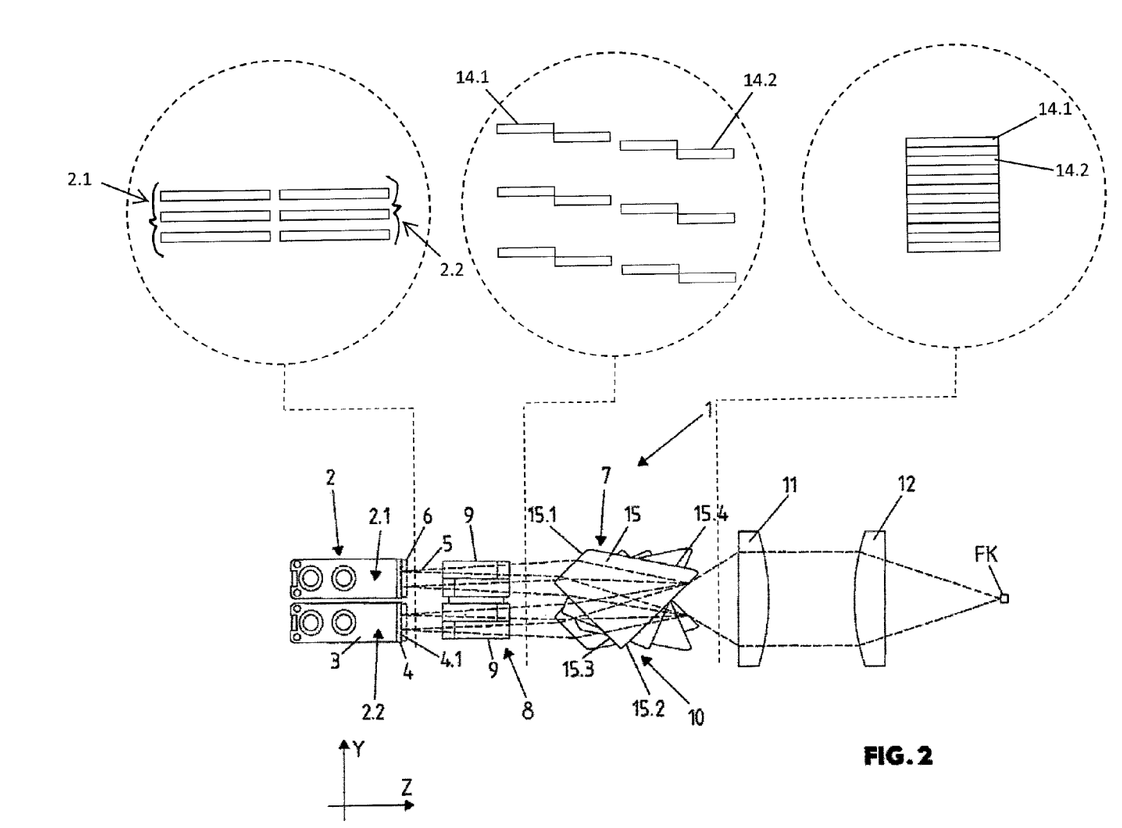
FIG. 2 shows the diode laser of FIG. 1 in plan view, where the plane of the drawing in FIG. 2 is oriented parallel to the active layer of the laser diode arrangement.
Figure 3:
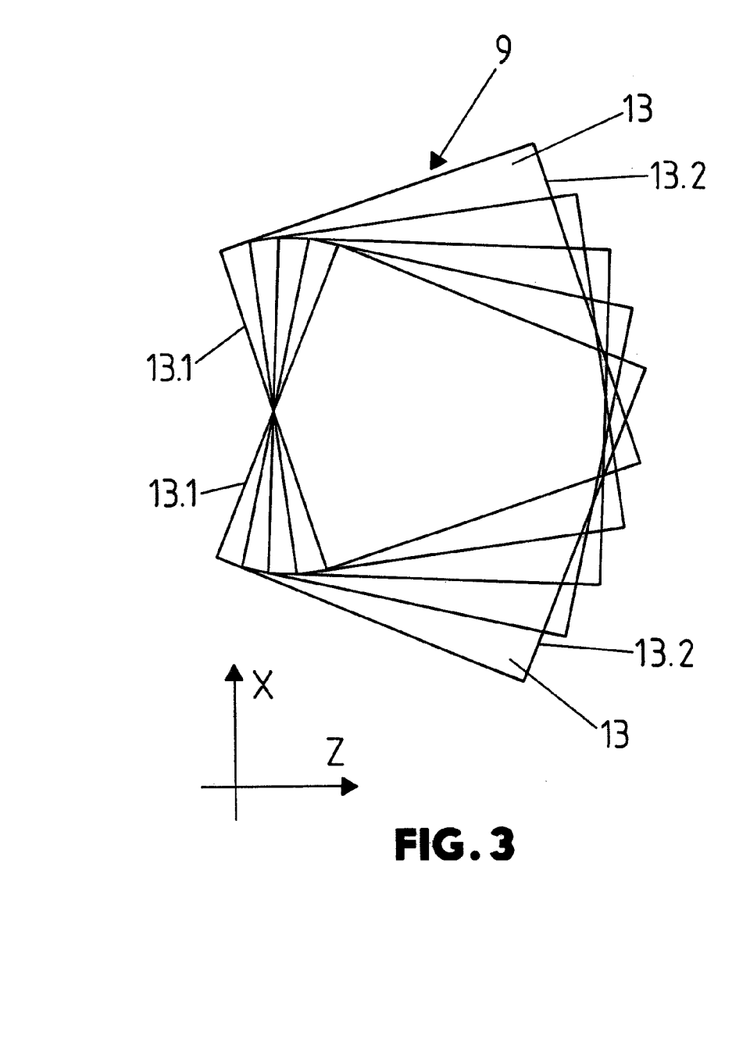
FIG. 3 shows one of the fast axis plate fans of the fast axis plate fan arrangement in individual view.
Figure 4:
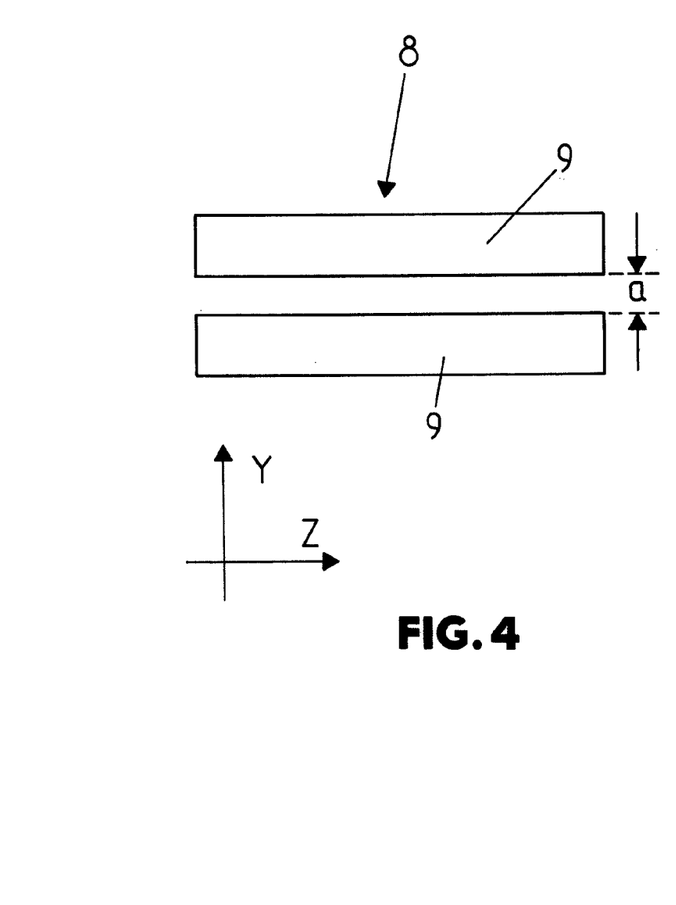
FIG. 4 shows two parallel and spaced-apart fast-axis plate fans of the fast-axis plate fan arrangement in plan view.
Figure 5:
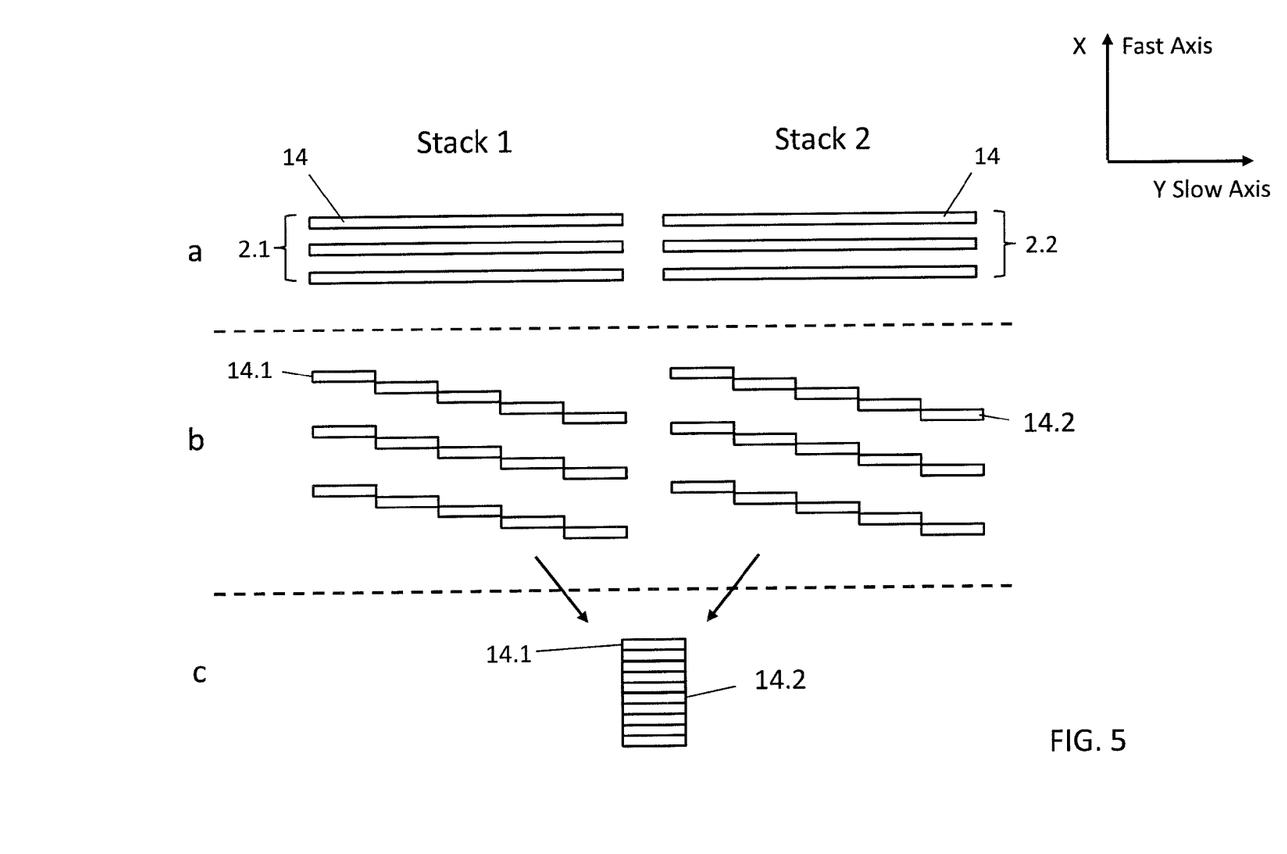
FIG. 5 shows in positions a-c in simplified view the fanning out of the beam bundles of a stack of the laser diode arrangement into the single beam bundles and the subsequent combining of the individual beam bundles to the reshaped beam bundle.

In the figures for better clarity and also for better understanding, the spatial axes oriented perpendicular to one another are each designated with X, Y and Z, specifically X axis, Y axis and Z axis. The plane of the drawing in FIGS. 1 and 3 is accordingly the XZ plane defined by the X axis and the Z axis, the plane of the drawing in FIGS. 2 and 4 is the YZ plane defined by the Y axis and the Z axis and the plane of the drawing in FIG. 5 is the XY plane defined by the X axis and the Y axis.

The diode laser 1 shown in the figures substantially consists of a laser diode arrangement 2 which, in the embodiment shown, consists of two parallel stacks 2.1 and 2.2 each comprising a plurality of heat sinks 3 and laser bars 4 provided on these. In the embodiment shown the heat sinks 3 and the laser bars 4 are configured identically in each stack 2.1 and 2.2. Furthermore, the heat sinks 3 and the laser bars 4 of the stack 2.1 are identical to the heat sinks 3 and laser bars 4 of the stack 2.2. In the embodiment shown, the heat sinks 3 are furthermore each square and configured as active heat sinks, i.e. as heat sinks through which a preferably liquid heat-transporting medium or cooling medium flows.

The heat-sinks 3 which adjoin one another in each stack 2.1 and 2.2 such that they rest against one another with upper and lower sides disposed in the YZ plane, preferably via an insulating intermediate layer (e.g. ceramic layer) are oriented with their longitudinal sides in the Z axis and each provided with the laser bar 4 on a narrow side extending in the direction of the Y axis. Furthermore, the stacks 2.1 and 2.2 are arranged mutually offset parallel to one another in the Y axis so that the laser bars 4 of both stacks 2.1 and 2.2 are arranged with their laser-light emitting emitters 4.1 or the laser light outlet in a common XY plane or substantially in a common XY plane and for example, respectively one laser bar 4 of a stack in the Y axis is arranged coaxially with a laser bar 4 of the other stack.

Each laser bar 4, which has a width of, for example, about 10 mm in the direction of the Y axis with a resonator length of about 2 to 4 mm, comprises a plurality of laser light emitting emitters 4.1 which are formed consecutively in the direction of the Y axis and mutually offset on the chip or laser bar 4. The typical optical output power of a laser bar 4 is for example a maximum of 250 Watt. In the slow axis, which corresponds to the Y axis, the angle of radiation or the laser beam divergence of the individual laser beams 5 lies in the range between 5° and 10°. In the fast axis, which corresponds to the X axis, the angle of radiation or the laser beam divergence of the individual laser beams 5 lies in the range between about 25° and 50°. For collimation of the laser beams 5 in the fast axis, i.e. in the X axis, the laser bars 4 are each provided with a fast-axis collimator 6 which, for example, consists of a continuous optical element (e.g. cylindrical lens) provided for each laser bar 4 and acting as fast axis collimator or of individual optical elements acting as a fast-axis collimator, of which each is assigned to a group of emitters 4.1. Typically each fast-axis collimator 6 consists of two elements or lenses each having a focal width, for example, in the range between 0.3 and 1.0 mm, where a so-called smile effect can be compensated by individual adjustment of these lenses, which results from the in particular thermal bending of the relevant laser bar 4 with respect to the YZ plane during operation of the diode laser 1.

For shaping and in particular for focusing the laser radiation delivered by the laser diode arrangement 2, the diode laser 1 comprises an optical arrangement (laser optics) designated generally by 7 in the figures, which in the embodiment shown consists of a fast-axis plate fan arrangement 8 with two parallel fast-axis plate fans 9, a slow-axis plate fan 10, an optical element 11 acting as a slow-axis collimator (e.g. in the form of a cylindrical lens) and of focusing optics 12 suitable for focusing the laser radiation into the focus FK, for example, in the form of at least one focusing lens. In detail the aforesaid elements of the optical arrangement 7 are arranged in the beam path of the laser radiation of the laser diode arrangement 2 or in the Z axis in such a manner that the fast-axis plate fan arrangement 8 or the fast-axis plate fans 9 thereof directly follows the diode arrangement 2 or the fast-axis collimators 6 there, the slow-axis plate fan 10 follows the fast-axis plate fan arrangement 8, the optical element 11 forms the slow-axis plate fan 10 and the focusing optics 12 follows the optical element 11.

The fast-axis plate fans 9 each consist of a plurality of plates 13 made of a light-conducting material, for example, of an optical glass. The plates 13 are identically designed in each fast-axis plate fan 9. Furthermore, in the embodiment shown the plates 13 of one fast-axis plate fan 9 are identical to the plates 13 of the other fast-axis plate fan 9 of the plate fan arrangement 8.

In the embodiment shown, each fast-axis plate fan 9 comprises five plates, where the number of plates 13 can be selected differently. For example, the fast-axis plate fans 9 can each comprise only two plates 13.

The plates 13 are arranged with their plate planes in the XZ plane and abut tightly against one another with their plate planes. Furthermore, the plates 13 and therefore also the fast-axis plate fans 9 extend at least over the entire height exhibited by the laser diode arrangement or the two stacks 2.1 and 2.2 in this axis. Each plate 13 forms two parallel narrow sides or plate edge regions 13.1 and 13, mutually offset in the direction of the Z axis, of which the narrow side 13.1 facing the laser diode arrangement 2 forms the inlet side and the narrow side 13.2 facing away from the laser diode arrangement 2 forms the outlet side for the laser radiation. The plates 13, which are designed as rectangular in the embodiment shown and in which the flat plate edge regions 13.1 and 13.2 oriented in each case perpendicular to the surface sides of the respective plate 13 form the longitudinal sides of the plate 13, are pivoted with respect to one another in a fan-like manner about a central axis oriented in the direction of the Y axis, so that each plate edge region 13.1 or 13.2 of plate 13 has an angular offset significantly less than 90° with respect to the corresponding plate edge region 13.1 or 13.2 of the neighbouring plate 13.

The thickness of the plates 13 is preferably selected so that it is at least the same, but preferably greater than the divergence exhibited by the beam bundles comprising those of the individual laser beams 5 which transilluminate the respective plate 13 so that no total reflection takes place inside the plates 13 in the region of the surface sides of the plates 13.

As shown by FIG. 2 in particular, each stack 2.1 and 2.2 is assigned a fast-axis plate fan 9 of the fast-axis plate fan arrangement 8. The width of each plate fan 9 in the direction of the Y axis is thereby equal to the width or the effective width possessed by the laser bars 4 in the relevant stack 2.1 or 2.2, also in the Y axis. Effective width is to be understood as the distance between the two outer emitters 4.1 of the relevant laser bar 4.

Since, as a result of the configuration of the laser bars 4 and for design reasons, it is not possible to arrange the stacks 2.1 and 2.2 or their laser bars 4 in such a manner that in each YZ plane the emitter 4.1 of one laser bar 4 of the stack 2 adjoins the emitter 4.1 of the corresponding laser bar 4 of the stack 2.2 in a seamless manner and whilst preserving the grid spacing exhibited by the emitter inside the baser bar 4 in the direction of the Y axis, but rather an enlarged offset compared with the grid spacing in the direction of the Y axis is unavoidable between a laser bar 4 of the stack 2.1 and a laser bar 4 of the stack 2.2 in the same YZ plane, for example, an offset of the order of magnitude of about 6 mm, the two parallel and identically configured fast-axis plate fans 9 of the fast-axis plate fan arrangement 8 are offset or arranged with the spacing a according to this offset in the Y axis.

As shown in FIG. 1, the identical fast-axis plate fans 9 are twisted relative to one another by an acute angle $\alpha$ about the plate fan axis oriented in the direction of the Y axis and specifically in the embodiment shown, in such a manner that each plate fan 9 is inclined by the same angle in each case but in the opposite direction with respect to the YZ plane.

In order to explain the mode of action of the plate fans 9, reference is made to positions 4a and 4b in FIG. 5. In position 4a, the laser radiation delivered by the laser bar 4 of a stack 2.1 or 2.2 is reproduced as a beam-shaped beam bundle 14 and specifically for a simpler representation, only for three laser bars 4 disposed in different YZ planes. Assuming five plates 13 of the fast-axis plate fan 9, each beam bundle 14 is fanned out by means of this plate fan into five individual beam bundles 14.1 which are then offset with respect to one another in a step-like manner in the X axis (position b). With the aid of the slow-axis plate fan 10, the individual beam bundles 14.1 are then shifted over one another in the direction of the slow axis or the Y axis so that the reshaped beam bundle 14.2 shown in position c is obtained. The beam bundle 14 emanating from the laser bar 4 of the stack 2.2 is then reshaped in the same way into the beam bundle 14.2 which then overlaps the beam bundle 14.2 of the stack 2.1 or is arranged parallel to the beam bundle 14.2 of the stack 2.1 as shown by broken lines in position c in FIG. 5.

The slow-axis plate fan 10 which has a height in the direction of the fast axis or in the direction of the X axis which is at least equal to the distance between the lowest laser bar in the stacks 2.1 and 2.2 and the highest laser bar 4 offset in the direction of the X axis, in turn consists of a plurality of plates 15 made of a light-conducting material, preferably of an optical glass, where the plates 15 are oriented with their adjoining surface sides in the YZ plane. Each plate 15 is in turn formed with two flat plate edge regions or sides 15.1 and 15.2 each oriented perpendicular to the plate surface sides and parallel to one another, of which the plate edge side 15.1 forms the inlet side and the plate edge side 15.2 forms the outlet side for the laser radiation. The plates 15 are twisted with respect to one another in a fan-like manner about an axis oriented in the direction of the fast axis or in the X axis so that the planes of the plate edge surfaces 15.1 or 15.2 of neighbouring plates are in turn offset with respect to one another by an angular offset significantly less than 90°. Furthermore, the slow-axis plate fan 10 is in particular designed with respect to the angular offset between neighbouring plates 15 to be mirror-symmetrical to a central plane M of the slow-axis plate fan 10, which (central plane) is an YZ plane.

In order to keep the dimension of the plate fans 10 in the direction of the Y axis or the slow axis as small as possible, in the embodiment shown the plates 15 has an approximately trapezoidal section and specifically such that a plate side 15.3 connecting the plate edge sides 15.1 and 15.2 is oriented perpendicular to or approximately perpendicular to the plate edge sides 15.1 and 15.2 and the other plate side 15.4 connecting the plate edge sides 15.1 and 15.2 encloses an angle of less than 90° with the plate edge side 15.2 so that the plate edge side 15.1 has a shorter length than the plate edge side 15.2. As can be further deduced from FIG. 2, the plates 15 in the stack forming the plate fan 10 are arranged in such a manner that the plates 15 disposed above the central plane M of the plate fan 10 in relation to the X axis, are used for shifting the beam bundles 14.1 of one stack, namely the stack 2.1, over one another and the plates 15 arranged below the central plane M are used for shifting the beam bundles 14.1 of the other stack, namely the stack 2.2, over one another. For this purpose, the lower plates 15 are turned towards the upper plates and in each case in such a manner that the sloping plate side 15.1 is in each case disposed on the outer side of the plate fan 10.

In the embodiment shown, the central plane M of the slow-axis plate fan 10 is also the central plane M of the laser diode arrangement 2 and intersects the axis about which not only the plates 13 of the plate fan 9 are twisted with respect to one another but also about which the plate fans 9 are pivoted with respect to one another.

Since the two fast-axis plate fans 9 are each arranged overall so that they are pivoted about their axis oriented in the Y axis and lying in the central plane M with respect to the central plane M and relative to one another, in the embodiment shown the beam bundle 14.1 of one stack, for example, the stack 2.1 in the view selected for FIG. 1 runs above the central plane M and the beam bundle 14.1 of the other stack, for example, the stack 2.2 runs below the central plane M.

The slow-axis plate fan 10 is followed by a slow-axis collimation of the beam bundle 14.2 by means of the element 11 and then focusing of the beam bundle 14.2 by means of the focusing optics 12 in focus designated by FK in the figures.

With the configuration described in the compact design of the diode laser 1, an increased optical power is possible for this diode laser. It was previously assumed that the laser diode arrangement 2 comprises two stacks 2.1 and 2.2. In principle, more than two stacks can be used, for example, three stacks, where each stack is in turn assigned a fast-axis plate fan 9 and these plate fans are spaced apart by the amount a in the relevant fast-axis plate fan arrangement 8 in the direction of the Y axis or in the direction of the slow axis.

It was previously assumed that the shifted-together beam bundles 14.2 of the two stacks 2.1 and 2.2 are mutually offset in the fast axis (X axis) so that all the beam bundles 14.2 of each stack directly adjoin one another. It is naturally possible to reshape the beam bundles 14 of the emitters of the two stacks 2.1 and 2.2 so that after passing the slow-axis plate fan 10, the beam bundles 14.2 of the two stacks 2.1 and 2.2 alternate in the total radiation in the direction of the fast axis (X axis), i.e. are offset in the direction of the X axis so that a beam bundle 14.2 of the stack 2.1 is followed by a beam bundle 14.2 of the stack 2.2 and this in turn is followed by a beam bundle 14.2 of the stack 2.1 etc., the beam bundles 14.2 of a stack, for example, the stack 2.1 are therefore provided between gaps of the beam bundles 14.2 of the other stack, for example, the stack 2.2 in the total radiation after the slow-axis plate fan 10.

It was further assumed previously that both fast-axis plate fans 9 of the fast-axis plate fan arrangement 8 are formed identically. In principle, however, it is also possible to form the plate fans differently, in particular with regard to the size of the plates 13, with regard to the angle of rotation of the plates 16 relative to one another etc. in order to thereby achieve a desired matching of the laser radiation or the beam bundles 14.1 and 14.2.

In particular, highly transparent special or quartz glasses are suitable as material for the plate fans 9 and 10 or their plates 13 and 15, where all the surfaces are provided with suitable anti-reflection coatings (AR coatings).

After the slow-axis collimator 11, which covers the entire radiation, highly parallel radiation is present which can be transmitted over a larger path length, for example, over a path length of up to one meter without any significant variation in the beam diameter.

At the focus FK, the laser radiation is, for example, coupled into a fiber-optical system via a fiber coupling or the laser radiation is focused by means of the element 12, for example, directly onto a surface to be acted upon by the laser radiation, for example, a material in order to thus achieve a direct laser material processing. Furthermore, the focusing optics 12 can have other optical elements, e.g. lens arrays in order to produce homogenised radiation fields with extensive expansion.

The previously described optical principle of the laser optics according to the invention for at least two laser bar stacks 2.1 and 2.2 enables the total power of the diode laser to be increased substantially. Diode lasers having merely one stack allow up to a maximum of 13 laser bars and a maximum of 8 stack units whose beams are combined to form a common output beam so that output powers up to 15 kW can be achieved. A higher number of laser bars per stack is not possible because of the requisite effective cooling. Heat sinks or active coolers having a minimum installation height of about 3.5 mm are required for cooling. The typical height of the laser beam in the direction of the fast axis is, however, only 0.5 to 1 mm so that the resulting laser beam of a stack in the beam path after the fast-axis collimator of such a stack has relatively large, non-emitting regions.

By using at least two mutually offset stacks 2.1 and 2.2 in the direction of the slow axis, the number of laser bars and emitters in the system can be doubled so that output powers up to 30 kW can be achieved. Due to the previously described configuration of the diode laser and its laser optics, the radiation of one stack is superposed with the radiation of the other stack and specifically by inserting the radiation of the other stack 2.2 into the gaps of the radiation of the first stack 2.1.

What is completely new with the previously described diode laser is that the radiation of the at least two stacks 2.1 and 2.2 is independently separated, i.e. fanned out by two separate plate fans acting in the fast axis and the fanned-out radiation of each stack is then shifted over one another by the slow-axis plate fan 10 in the slow axis. This is accomplished so that all the regions without radiation present in the fast axis are completely filled so that at the exit of the slow-axis plate fan 9 a gap-free or substantially gap-free distribution of the laser radiation exists in the direction of the fast axis.

An improved beam quality is achieved with the configuration according to the invention, in particular by the fast-axis plate fan 8 so that, inter alia, it is possible to couple the laser radiation into round fibers having a diameter of 1.2 to 2.0 mm of a fiber-optic system.

In practice, it would be possible, for example, to have an arrangement with two stacks (double stack arrangement) and a triple splitting or fanning out of the radiation of each stack 2.1 and 2.2 in the fast-axis plate fan 8 (double stack arrangement with a maximum of 26 laser bars; the eightfold arrangement of the double stack arrangement gives a maximum output power of 30 kW) or alternatively an arrangement with three stacks (triple stack arrangement) each with double splitting or fanning out of the radiation of each stack in the fast-axis plate fan 8 (three stacks with a maximum of 39 components; the eightfold arrangement of the triple stack arrangements gives a maximum output power of 45 kW).

REFERENCE LIST

1 Diode laser
2 Laser diode arrangement
2.1, 2.2 Stack
3 Heat sink
4 Laser bar
4.1 Emitter
5 Single laser beam
6 Fast-axis collimator
7 Optical arrangement
8 Fast-axis plate fan arrangement
9 Fast-axis plate fan
10 Slow-axis plate fan
11 Slow-axis collimator
12 Focusing optics
13 Plate
13.1, 13.2 Plate edge region
14 Beam bundle
14.1 Fanned-out beam bundle
14.2 Reshaped or shifted-together beam bundle
15 Plate
15.1, 15.2 Plate edge region
15.3, 15.4 Plate edge
a Distance between plate fans
α Angle of twist between the plate fans 9 of the plate fan arrangement 8
M Central plane of the laser diode arrangement 2 and of the optical arrangement 7 oriented perpendicular to the fast axis
X X axis
Y Y axis
Z Z axis and axis of the optical arrangement 7

The invention claimed is:

1. A diode laser comprising:
a laser diode arrangement having a central plane with a plurality of laser bars,
wherein each of the plurality of laser bars are disposed on a front side of a support and has a plurality of emitters generating a plurality of laser beams and wherein some of the plurality of laser bars are arranged offset with respect to one another in a first axial direction corresponding to a slow axis of the plurality of laser beams,
wherein the plurality of laser bars with the support are provided offset to one another in a stacked manner in at least a first stack and a second stack to form the laser diode arrangement, each stack in a second axial direction corresponding to a fast axis direction of the plurality of laser beams and are oriented perpendicular to the first axial direction,
the laser diode arrangement comprising fast axis collimators, at least one of the fast axis collimators is assigned to each of the plurality of laser bars disposed parallel to one another, and
the diode laser further comprising an optical arrangement for forming laser beam bundles comprised of the plurality of laser beams generated by the plurality of emitters,
wherein the optical arrangement comprises at least one fast axis plate fan arrangement for fanning out a laser beam bundle in the fast axis direction and a slow axis plate fan arrangement following the fast axis plate fan arrangement in a beam path for combining a fanned-out laser beam bundle in the slow axis direction,
wherein the fast axis plate fan arrangement comprises at least a first fast axis plate fan and a second fast axis plate fan arranged parallel to one another and at a distance from one another in the direction of the slow axis direction of laser radiation,
wherein the first fast axis plate fan and the second fast axis plate fan each comprises a plurality of plates perpendicular to the slow axis direction and are turned around the slow axis direction with respect to one another by an angular magnitude so that at least the first fast axis plate fan and the second fast axis plate fan form separate fanned-out laser beam bundles which are separate for each stack and offset relative to one another in the fast axis direction and which are combined in the slow axis direction by the slow axis plate fan arrangement to form a combined laser beam bundle comprising the plurality of laser beams of the separate fanned out laser beam bundles, wherein the slow axis plate fan arrangement consists of a plurality of plates made of light-conducting material, wherein each of the plurality of plates is in turn formed with a first flat plate edge side and a second flat plate edge side oriented perpendicular to plate surfaces sides and parallel to each other, the first flat plate edge side forming an inlet side for laser radiation and the second flat plate edge side forming an outlet side for the laser radiation, each of the plurality of plates also includes a third edge side and a fourth edge side each connecting the first flat plate edge side and the second flat plate edge side, the plurality of plates having an approximately trapezoidal section and the first flat plate edge side having a shorter length than the second flat plate edge side and the plurality of plates are twisted with respect to one other in a fan-like manner about an axis oriented in the fast axis direction so that planes of the first and second plate edges of neighboring plates are in turn offset with respect to one another by an angular offset less than 90°.

2. The diode laser according to claim 1, wherein a number of fast axis plate fans of the fast axis plate fan arrangement is equal to a number of stacks of the diode laser arrangement.

3. The diode laser according to claim 2, wherein a width of the first fast axis plate fan and the second fast axis plate fan of the fast axis plate fan arrangement in the direction of the slow axis direction of the laser radiation is equal to the width of the plurality of laser bars in the slow axis direction or equal to the maximum distance between two emitters on the plurality of laser bars.

4. The diode laser according to claim 2, wherein the first fast axis plate fan and the second fast axis plate fan of the fast axis plate fan arrangement each comprises a plurality of plates made of a light-conducting material, the plurality of plates with their surface sides resting against one another are oriented perpendicular to the slow axis direction of the laser radiation and form an inlet side or an outlet side for laser radiation at two mutually opposite plate edge regions oriented perpendicular to plate surfaces sides and that the plurality of plates in the first fast axis plate fan and the second fast axis plate fan are provided twisted with respect to one another in a fan-like manner, that both inlet side and outlet side of each plate has an angular offset forming an acute angle with the inlet side or the outlet side of a neighboring plate.

5. The diode laser according to claim 4, wherein the light-conducting material is an optical glass.

6. The diode laser according to claim 4, wherein, the inlet and outlet side for laser radiation are formed by plate edge regions of the plurality of plates running parallel to one another.

7. The diode laser according to claim 2, wherein the first fast axis plate fan and the second fast axis plate fan forming the fast axis plate fan arrangement are provided twisted with respect to one another about the slow axis direction which is also the axis about which individual plates of the first fast axis plate fan and the second fast axis plate fan are twisted with respect to one another in a fan-like manner.

8. The diode laser according to claim 2, wherein each slow axis plate fan of the slow axis plate fan arrangement comprises a plurality of plates made of a light-conducting material, which are oriented with adjoining surface sides perpendicular to the fast axis direction of laser radiation and form an inlet side and an outlet side for the laser radiation at two mutually opposite plate edge regions and which are twisted with respect to one another in fan-like manner about an axis parallel to the fast axis direction so that the inlet side and the outlet side of a plate has an angular offset forming an acute angle with respect to the neighbouring inlet side and outlet side of the neighbouring plate, and the at least two slow axis plate fans are configured mirror-symmetrically in regard to shape or arrangement of the plates to a central plane (M) of the slow axis plate fan arrangement oriented perpendicular to the fast axis direction of the laser radiation.

9. The diode laser according to claim 2, further comprising slow axis collimator optics which is disposed in a beam path of laser radiation following the slow axis plate fan arrangement and covers the laser radiation.

10. The diode laser according to claim 2, further comprising focusing optics for focusing laser radiation in a focus on a surface to be treated with the laser radiation or on a fiber coupling for coupling into fiber-optics.

11. The diode laser according to claim 2, further comprising focusing optics comprising optical elements to produce a homogenised radiation field with an extensive extension.

12. The diode laser according to claim 1, wherein a width of each of the fast axis plate fans of the fast axis plate fan arrangement in the direction of the slow axis direction of the laser radiation is equal to the width of the plurality of laser bars in the slow axis direction or equal to the maximum distance between two emitters on the plurality of laser bars.

13. The diode laser according to claim 1, wherein the first fast axis plate fan and the second fast axis plate fan of the fast axis plate fan arrangement each comprise a plurality of plates made of a light-conducting material, the plurality of plates with their surface sides resting against one another are oriented perpendicular to the slow axis direction of the laser radiation and form an inlet side or an outlet side for laser radiation at two mutually opposite plate edge regions oriented perpendicular to plate surface sides and that the plurality of plates in the first fast axis plate fan and the second fast axis plate fan are provided twisted with respect to one another in a fan-like manner, that both inlet side and outlet side of each plate has an angular offset forming an acute angle with the inlet side or the outlet side of a neighboring plate.

14. The diode laser according to claim 13, wherein the light-conducting material is an optical glass.

15. The diode laser according to claim 13, wherein the inlet and outlet side for laser radiation are formed by plate edge regions of the plurality of plates running parallel to one another.

16. The diode laser according to claim 1, wherein the first fast axis plate fan and the second fast axis plate fan forming the fast axis plate fan arrangement are provided twisted with respect to one another about the slow axis direction which is also the axis about which individual plates of each the first fast axis plate fan and the second fast axis plate fan are twisted with respect to one another in a fan-like manner.

17. The diode laser according to claim 1, wherein each slow axis plate fan of the slow axis plate fan arrangement comprises a plurality of plates made of a light-conducting material, which are oriented with adjoining surface sides perpendicular to the fast axis direction of laser radiation and form an inlet side and an outlet side for the laser radiation at two mutually opposite plate edge regions and which are twisted with respect to one another in fan-like manner about an axis parallel to the fast axis direction so that the inlet side and the outlet side of a plate has an angular offset forming an acute angle with respect to the neighbouring inlet side and outlet side of the neighbouring plate, and the at least two slow axis plate fans are configured mirror-symmetrically in regard to shape or arrangement of the plates to a central plane (M) of the slow axis plate fan arrangement oriented perpendicular to the fast axis direction of the laser radiation.

18. The diode laser according to claim 1, further comprising slow axis collimator optics which is disposed in a beam path of laser radiation following the slow axis plate fan arrangement and covers the laser radiation.

19. The diode laser according to claim 1, further comprising focusing optics for focusing laser radiation in a focus on a surface to be treated with the laser radiation or on a fiber coupling for coupling into fiber-optics.

20. The diode laser according to claim 1, further comprising focusing optics comprising optical elements to produce a homogenised radiation field with an extensive extension.

* * * * *